United States Patent
Mahadeswaraswamy et al.

(10) Patent No.: US 9,338,871 B2
(45) Date of Patent: May 10, 2016

(54) FEEDFORWARD TEMPERATURE CONTROL FOR PLASMA PROCESSING APPARATUS

(75) Inventors: Chetan Mahadeswaraswamy, Sunnyvale, CA (US); Walter R. Merry, Sunnyvale, CA (US); Sergio Fukuda Shoji, San Jose, CA (US); Chunlei Zhang, Santa Clara, CA (US); Yashaswini B. Pattar, Palo Alto, CA (US); Duy D. Nguyen, Milpitas, CA (US); Tina Tsong, San Jose, CA (US); Shane C. Nevil, Livermore, CA (US); Douglas A. Buchberger, Jr., Livermore, CA (US); Fernando M. Silveira, Livermore, CA (US); Brad L. Mays, San Jose, CA (US); Kartik Ramaswamy, San Jose, CA (US); Hamid Noorbakhsh, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 542 days.

(21) Appl. No.: 12/905,624

(22) Filed: Oct. 15, 2010

(65) Prior Publication Data
US 2011/0186545 A1    Aug. 4, 2011

Related U.S. Application Data (60) Provisional application No. 61/299,818, filed on Jan. 29, 2010.

(51) Int. Cl.
*G01L 21/30* (2006.01)
*G01R 31/00* (2006.01)
(Continued)

(52) U.S. Cl.
CPC ........ *H05H 1/0081* (2013.01); *H01J 37/32935* (2013.01)

(58) Field of Classification Search
CPC ............. H01L 21/67109; G01K 17/08; G05B 2219/49073; G01N 2223/31
USPC ................ 216/59; 438/710, 715; 156/345.27, 156/345.45
See application file for complete search history.

(56) References Cited

U.S. PATENT DOCUMENTS 5,435,145 A * 7/1995 Jaster .............................. 62/115
5,548,470 A   8/1996 Husain et al.
(Continued)

FOREIGN PATENT DOCUMENTS

CN    1956143 A      5/2007
CN    101320675 A   12/2008
(Continued)

OTHER PUBLICATIONS

"Integral Action and PI Control", Doug J. Cooper, webpage published in 2008 (attached).*
(Continued)

*Primary Examiner* — Thomas Pham
(74) *Attorney, Agent, or Firm* — Blakely Sokoloff Taylor & Zafman LLP (57) ABSTRACT

Methods and systems for controlling temperatures in plasma processing chamber with reduced controller response times and increased stability. Temperature control is based at least in part on a feedforward control signal derived from a plasma power input into the processing chamber. A feedforward control signal compensating disturbances in the temperature attributable to the plasma power may be combined with a feedback control signal counteracting error between a measured and desired temperature.

14 Claims, 8 Drawing Sheets

(51) Int. Cl.
  *H01L 21/302* (2006.01)
  *H01L 21/461* (2006.01)
  *H01L 21/306* (2006.01)
  *C23F 1/00* (2006.01)
  *H05H 1/00* (2006.01)
  *H01J 37/32* (2006.01)

(56) References Cited

U.S. PATENT DOCUMENTS

| | | | |
|---|---|---|---|
| 5,644,467 | A | 7/1997 | Steger et al. |
| 6,026,986 | A | 2/2000 | Choi et al. |
| 6,125,025 | A | 9/2000 | Howald et al. |
| 6,142,208 | A | 11/2000 | Eberhardt et al. |
| 6,221,205 | B1 | 4/2001 | Blalock et al. |
| 6,266,968 | B1 | 7/2001 | Redlich |
| 6,606,234 | B1 | 8/2003 | Divakar |
| 6,635,117 | B1 | 10/2003 | Kinnard et al. |
| 6,782,843 | B2 | 8/2004 | Kinnard et al. |
| 6,891,124 | B2 | 5/2005 | Denton et al. |
| 6,921,724 | B2 | 7/2005 | Kamp et al. |
| 7,069,984 | B2 | 7/2006 | Jeong |
| 7,221,553 | B2 | 5/2007 | Nguyen et al. |
| 8,226,769 | B2 | 7/2012 | Matyushkin et al. |
| 8,608,852 | B2 | 12/2013 | Mahadeswaraswamy et al. |
| 2002/0162175 | A1 | 11/2002 | Berglund |
| 2003/0205328 | A1 | 11/2003 | Kinnard et al. |
| 2006/0027324 | A1 | 2/2006 | Makino et al. |
| 2006/0076109 | A1 | 4/2006 | Holland et al. |
| 2006/0196451 | A1 | 9/2006 | Braun et al. |
| 2006/0269691 | A1 | 11/2006 | Saki |
| 2007/0032087 | A1 | 2/2007 | Nishino et al. |
| 2007/0080136 | A1 | 4/2007 | Takata et al. |
| 2007/0084563 | A1 | 4/2007 | Holland |
| 2007/0091537 | A1* | 4/2007 | Buchberger et al. ......... 361/234 |
| 2007/0091538 | A1 | 4/2007 | Buchberger, Jr. et al. |
| 2008/0023139 | A1 | 1/2008 | Yasui et al. |
| 2008/0035306 | A1 | 2/2008 | White et al. |
| 2008/0060978 | A1 | 3/2008 | Wegner |
| 2008/0224273 | A1 | 9/2008 | America et al. |
| 2008/0271471 | A1 | 11/2008 | Nozawa et al. |
| 2008/0311756 | A1 | 12/2008 | Chen et al. |
| 2009/0044752 | A1 | 2/2009 | Furuya |
| 2009/0065181 | A1 | 3/2009 | Mockry et al. |
| 2009/0155437 | A1 | 6/2009 | Bohnert et al. |
| 2009/0183677 | A1 | 7/2009 | Tian et al. |
| 2009/0229638 | A1 | 9/2009 | Yun et al. |
| 2009/0294101 | A1 | 12/2009 | Fovell et al. |
| 2009/0310645 | A1* | 12/2009 | Kofuji et al. ................ 374/12 |
| 2010/0083952 | A1 | 4/2010 | van Houten |
| 2010/0116788 | A1 | 5/2010 | Singh et al. |
| 2010/0210041 | A1* | 8/2010 | Chang et al. ................. 438/8 |
| 2012/0048467 | A1* | 3/2012 | Mahadeswaraswamy et al. ........... 156/345.27 |
| 2012/0132397 | A1 | 5/2012 | Buchberger et al. |
| 2013/0023122 | A1 | 1/2013 | Nemani et al. |
| 2013/0023123 | A1 | 1/2013 | Zhou et al. |
| 2013/0023124 | A1 | 1/2013 | Nemani et al. |
| 2013/0109187 | A1 | 5/2013 | Nemani et al. |
| 2013/0109188 | A1 | 5/2013 | Kim et al. |
| 2013/0224962 | A1 | 8/2013 | Koelmel et al. |
| 2013/0279066 | A1 | 10/2013 | Lubomirsky et al. |

FOREIGN PATENT DOCUMENTS

| | | |
|---|---|---|
| CN | 101583234 A | 11/2009 |
| EP | 0 766 300 A1 | 4/1997 |
| EP | 1 770 753 B1 | 12/2010 |
| JP | H07-96170 | 4/1995 |
| JP | H0855905 A | 2/1996 |
| JP | 2001-060585 | 3/2001 |
| JP | 2001-60585 A | 3/2001 |
| JP | 2001-237226 | 8/2001 |
| JP | 2002009049 A | 1/2002 |
| JP | 2002-071234 | 3/2002 |
| JP | 2004-63670 | 2/2004 |
| JP | 2004169933 A | 6/2004 |
| JP | 2005-079415 | 3/2005 |
| JP | 2005150173 A | 6/2005 |
| JP | 2005175460 A | 6/2005 |
| JP | 2006-049497 A | 2/2006 |
| JP | 2007501907 A | 4/2006 |
| JP | 2006-351887 | 12/2006 |
| JP | 2006-351887 A | 12/2006 |
| JP | 2007-88394 | 4/2007 |
| JP | 2007-157696 | 6/2007 |
| JP | 2007-316039 A | 12/2007 |
| JP | 2008177428 | 7/2008 |
| JP | 2008-305856 | 12/2008 |
| JP | 2008-305856 A | 12/2008 |
| JP | 3147392 | 12/2008 |
| JP | 2010-097854 A | 4/2010 |
| KR | 10-2008-0107261 | 12/2008 |
| KR | 10-2009-0118839 | 11/2009 |
| TW | I358765 | 10/1995 |
| TW | 200816362 | 8/1996 |
| TW | 200912989 | 4/1997 |
| TW | I314842 | 1/2006 |
| TW | 200727325 A | 7/2007 |
| TW | 200952068 A1 | 12/2009 |
| WO | WO 00/19519 | 4/2000 |
| WO | WO 02/21590 A2 | 3/2002 |
| WO | WO 2010/055441 A2 | 5/2010 |

OTHER PUBLICATIONS

PCT/US2011/039182 PCT International Search Report, Filed Jun. 3, 2011, 3 pages.

PCT/US2010/062435 PCT International Search Report, filed Aug. 22, 2011, 3 pages.

PCT/US2011/037436 PCT International Search Report, filed Nov. 28, 2011, 3 pages.

International Preliminary Report on Patentability for corresponding International Application No. PCT/US2010/062435 filed Dec. 29, 2010, dated Jul. 31, 2012, 5pgs.

Howard, Brad, "Applied Centura Avatar Etch Enabling New Dimensions in High Aspect Ratio Etching," Silicon Systems Group, Jun. 27, 2012, 20pgs.

Japanese Office Action dated Aug. 17, 2015 for corresponding Japanese Application No. 2012-551168.

Search Report for Taiwan Invention App. No. 100118159; filed May 24, 2011, dated Nov. 22, 2014.

Chinese Search Report for China App. No. 201080062730.4; filed Dec. 29, 2010, dated Oct. 2, 2014.

* cited by examiner

| Plasma Power Setpoint | Tsp = 60C | Tsp = 70C | Tsp = 80C | Tsp = 90C |
|---|---|---|---|---|
| 0 W (or idle condition) | GAIN GROUP 1 | GAIN GROUP 2 | ... | |
| <= 1000 W | GAIN GROUP N | ... | | |
| <= 2000 W | ... | | | |
| ...... | | | | |
| <= 7000 W | | | | |
| > 7000 W | | | | |
| Spare | | | | |

| Power/Temp | < -500W | -4500 to -5400W | -3500 to -4499W | -2500 to -3499W | -1500 to -2499W | -500 to -1499W | -499 to 499W | 500 to 1499W | 1500 to 2499W | 2500 to 3499W | 3500 to 4499W | 4500 to 5499W | >5500W |
|---|---|---|---|---|---|---|---|---|---|---|---|---|---|
| <-45C | 1 | ... | ... | ... | ... | ... | ... | ... | ... | ... | ... | ... | ... |
| -36C to -45C | 2 | ... | ... | ... | ... | ... | ... | ... | ... | ... | ... | ... | ... |
| -26C to -35C | ... | ... | ... | ... | ... | ... | ... | ... | ... | ... | ... | ... | ... |
| -16C to -25C | ... | ... | ... | ... | ... | ... | ... | ... | ... | ... | ... | ... | ... |
| -6C to -15C | ... | ... | ... | ... | ... | ... | ... | ... | ... | ... | ... | ... | ... |
| -5C to 5C | ... | ... | ... | ... | ... | ... | ... | ... | ... | ... | ... | ... | ... |
| -6C to 15C | ... | ... | ... | ... | ... | ... | ... | ... | ... | ... | ... | ... | ... |
| 16C to 25C | ... | ... | ... | ... | ... | ... | ... | ... | ... | ... | ... | ... | ... |
| 26C to 35C | ... | ... | ... | ... | ... | ... | ... | ... | ... | ... | ... | ... | ... |
| 26C to 35C | ... | ... | ... | ... | ... | ... | ... | ... | ... | ... | ... | ... | ... |
| >45C | ... | ... | ... | ... | ... | ... | ... | ... | ... | ... | ... | ... | N |

FEEDFORWARD TEMPERATURE CONTROL FOR PLASMA PROCESSING APPARATUS

CROSS-REFERENCE TO RELATED APPLICATIONS

This application claims the benefit of U.S. PROVISIONAL PATENT APPLICATION 61/299,818 filed Jan. 29, 2010, incorporated herein by reference in its entirety for all purposes.

BACKGROUND

1) Field

Embodiments of the present invention generally relate to plasma processing equipment, and more particularly to methods of controlling temperatures during processing of a workpiece with a plasma processing chamber.

2) Description of Related Art

In a plasma processing chamber, such as a plasma etch or plasma deposition chamber, the temperature of a chamber component is often an important parameter to control during a process. For example, a temperature of a substrate holder, commonly called a chuck or pedestal, may be controlled to heat/cool a workpiece to various controlled temperatures during the process recipe (e.g., to control an etch rate). Similarly, a temperature of a showerhead/upper electrode or other component may also be controlled during the process recipe to influence the processing. Conventionally, a heat sink and/or heat source is coupled to the processing chamber to control the temperature of a chamber component at a setpoint temperature. A controller, such as a PID (proportional-integral-differential) controller is employed for feedback control of the heat transfer between the temperature controlled component and the heat sink/source. Steady state errors occur with simple feedback control unless a large enough integrator is used. In simple Proportional control there is always steady state error in the presence of external disturbance (unless proportional gain is infinity). However use of large integral control results in poor transients with large overshoots and requires long settling times. Unlike mass flow controllers (MFCs) which have short response times requiring only a few seconds to converge to a setpoint, chamber component temperatures, such as an electrostatic chuck or showerhead temperature, may require 30 seconds or more to stabilize when perturbed during a plasma process due to the significant thermal mass of the chuck, etc. As such, to most quickly compensate for disturbances, large integrator values may be utilized in the feedback controller which has the undesirable side effect of making the temperature control more unstable.

Furthermore, to accommodate increasingly complex film stacks, many plasma processes expose a workpiece to a number of sequential plasma conditions within a same processing chamber. Operations in such in-situ recipes (performed within a single manufacturing apparatus rather than in separately tuned systems) may require temperature setpoints spanning a wide range which introduces a non-linearity into the system such that perturbations or disturbances occurring while the temperature is near a system extreme render response times intolerable.

A temperature control architecture for a plasma processing chamber that improves stability and provides for improved transient response and small steady state error when perturbed is therefore desirable.

SUMMARY

Methods and systems for controlling a process or chamber component temperature as a plasma process is executed by plasma processing apparatus are described herein. In certain embodiments, methods and systems incorporate a feedforward control algorithm to advantageously reduce steady state errors and improve response times.

Certain embodiments include a method whereby a temperature in the process chamber is controlled at least in part with a feedforward control signal based on a plasma power heat load of a plasma power source coupled into a process chamber. In particular embodiments, a transfer function of an input plasma power signal is to compensate a heating of the process chamber by the plasma power output by the power source. In one such embodiment, heat transfer between the process chamber and a heat sink/heat source external to the process chamber is controlled based on the plasma power signal to compensate the disturbance in temperature resulting from the plasma power input to the process chamber. In a further embodiment, the temperature control method further includes a feedback control signal to counteract an error between the temperature, as measured, and a desired temperature.

In one embodiment, the plasma power output control signal input includes a first bias power input to a chuck configured to support the workpiece during processing and the feedforward control signal utilizes a predefined transfer function relating the bias power input to the chuck temperature to compensate a heating of the chuck by the applied plasma power. In a further embodiment, the plasma power output comprises a second bias power input to the chuck and the feedforward control signal utilizes a predefined transfer function between a total of the first and second bias power and the chuck temperature to compensate a heating of the chuck by the applied plasma power.

Embodiments include a computer readable media storing instructions which, when executed by a processing system, cause the processing system to control a temperature in a process chamber at least in part with a feedforward control signal based on a power output from a power source coupled into the process chamber. In particular embodiments, the computer readable media includes a transfer function between the plasma power signal and the temperature and further includes instructions to compensate a heating of the process chamber by the plasma power output. In one such embodiment, the computer readable media includes instructions for controlling heat transfer between the process chamber and a heat sink external to the process chamber. In a further embodiment, the computer readable media includes instructions for temperature control with a feedback control signal to counteract an error between the temperature as measured and a desired temperature.

Embodiments include a plasma processing chamber, such as a plasma etch or plasma deposition system, having a temperature controlled component to be coupled to a heat sink/heat source. A plasma power source is to be coupled to the processing chamber to energize a process plasma during processing of a workpiece disposed in the process chamber. A temperature controller manages heat transfer between the temperature controlled component and the heat sink/heat source by way of a feedforward control signal. A feedback signal may also be employed in combination with the feedforward signal. In one particular embodiment, the temperature controlled component comprises a chuck configured to support the workpiece during processing. In a further embodiment, the temperature controller is communicatively coupled to the plasma power source so that the feedforward control signal may be based on a plasma power output by the plasma power source to compensate a plasma heating of the temperature controlled component. The temperature controller may be further communicatively coupled to the heat sink/heat source (or a controller thereof) so that the feedforward control signal may be further based on the temperature difference between the temperature controlled component and the heat sink/heat source.

BRIEF DESCRIPTION OF THE DRAWINGS

Embodiments of the invention are particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of embodiments of the invention. However, it will be understood by those skilled in the art that other embodiments may be practiced without these specific details. In other instances, well-known methods, procedures, components and circuits have not been described in detail so as not to obscure the present invention. Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm or method is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, levels, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

Embodiments of methods and systems for controlling a process or chamber component temperature described herein provide a temperature control effort via a feedforward control line that produces a feedforward control signal that compensates a disturbance transfer function. More particularly, the feedforward control transfer function is preferably equal and opposite to the disturbance transfer function to neutralize the disturbance to the temperature being controlled. In further embodiments, the feedforward control signal is added to a feedback control effort such that the feedback loop is called upon to provide a lesser control effort and therefore allow for lower feedback gains for temperature error correction than required in the absence of the feedforward control signal. With the lower feedback gains, improved temperature stability and improved transient responses (e.g., reduced overshoot, reduced rise time, etc.) relative to conventional plasma processing systems are achieved.

Figure 1:
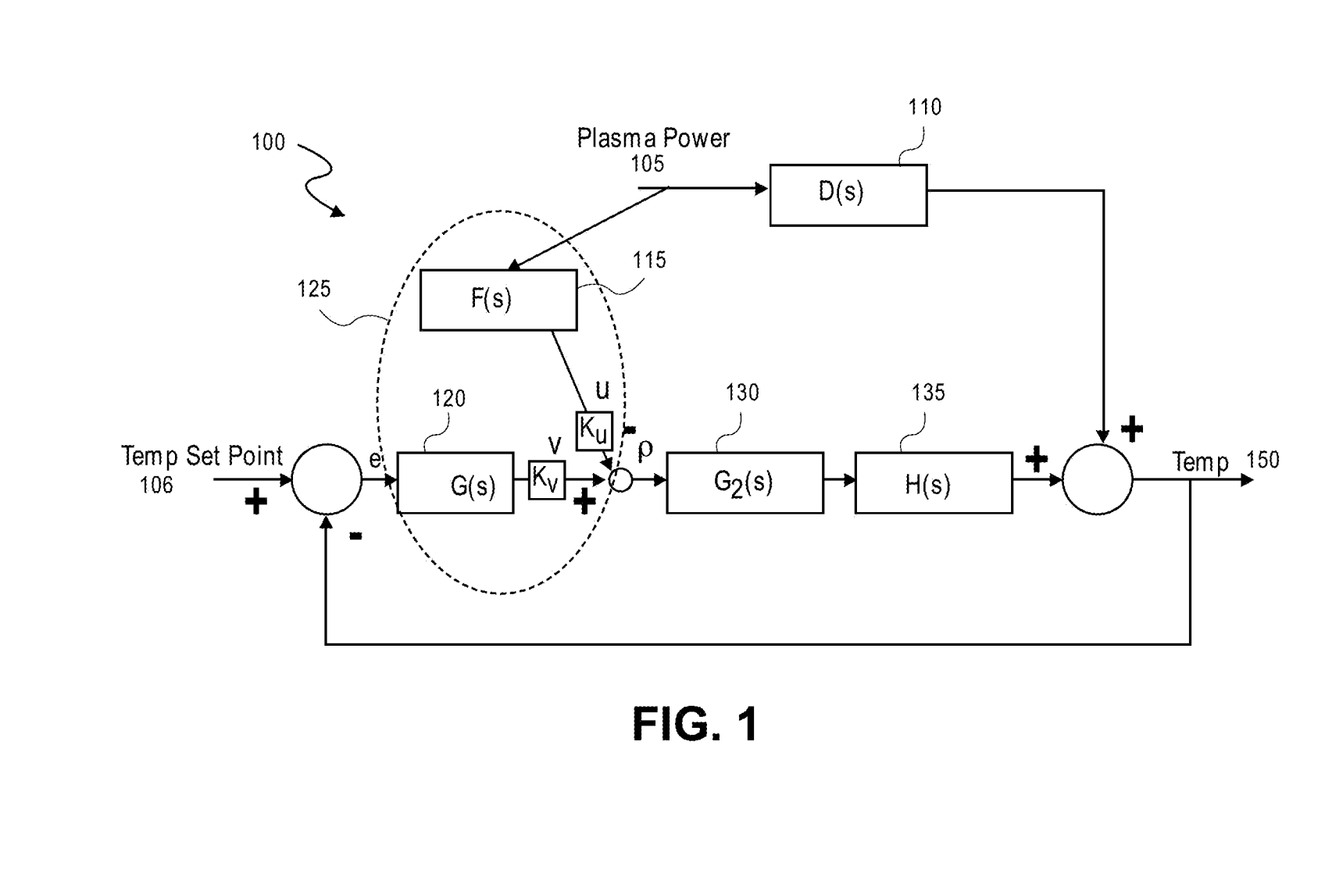
FIG. 1 is a block diagram illustrating a temperature control system including both feedforward and feedback control elements, in accordance with an embodiment of the present invention.

FIG. 1 is a block diagram illustrating a temperature control system 100 in the Laplace domain including both feedforward (e.g., F(s) 115) and feedback (e.g., G(s) 120) control elements, in accordance with an embodiment of the present invention. Because commercially available temperature controllers lack a feedforward input for disturbance compensation (e.g., providing only for a feedback control with inputs including a measured controlled temperature 150 and setpoint temperature 106), particular embodiments provide feedforward control by moving control computations for the feedback transfer function G(s) 120 off an autonomous temperature control plane (e.g., a discrete PID controller of a heat sink or heat source) and onto an integrated control software plane 125 of the plasma processing system which computes both the feedback and feedforward control efforts. As further described herein, a discrete temperature controller may then operate in a manual mode merely as a driver of the control actuators (e.g., valves, resistive elements, etc.) operating under the direction of the integrated plasma chamber control software plane 125 executing instructions implementing the temperature control system 100. In alternative embodiments however, a discrete temperature controller is configured to provide the feedforward control described herein with the associated control computations off-loaded from the integrated control software plane 125.

As shown in FIG. 1, the temperature control system 100 includes the feedforward transfer function F(s) 115 which takes, as an input, a plasma power 105 introduced into the plasma process chamber during processing of a workpiece. The plasma power 105 input into the feedforward line may be based on any power output by a plasma power source, such as an RF generator, magnetron, etc., that places an appreciable heat load on the temperature controlled system component. In one such embodiment, the plasma power 105 is modeled as a weighted sum of multiple power inputs to the processing chamber. For example, a weighted sum of Plasma Power equals c1*P1+c2*P2+c3*P3, where P1, P2 and P3 are each a bias or source power. The weights c1, c2, and c3 may be any real number, and are typically positive although in certain embodiments, a weight of a source power is negative where component heating is actually reduced with increased source power.

The feedforward transfer function F(s) 115 is to emulate the disturbance transfer function D(s) 110 and output a feedforward control signal u providing a control effort opposite in sign to the disturbance transfer function D(s) 110 and compensating an increase in the controlled temperature 150 resulting from the disturbance caused by the plasma source power heat load. The disturbance transfer function D(s) 110 relates a heat load of the plasma power 105 to a rise in the controlled temperature 150 of the plasma processing system having a particular thermal time constant, τ. For example, a step function increase in a plasma power from 0 W to 1000 W at time t may be mapped by the disturbance transfer function D(s) 110 to a system temperature rise over time.

In the depicted embodiment, the feedforward control signal u is coupled with a feedback control loop in which the feedback transfer function G(s) 120 provides a feedback control signal v. The temperature control system 100 retains the feedback control signal v for correction of the error signal e corresponding to a difference between the controlled temperature 150 and the setpoint temperature 106.

In the embodiment illustrated in FIG. 1, the feedforward control signal u, along with the setpoint temperature 106, is input to an actuator transfer function $G_2(s)$ 130 and a thermal mass transfer function H(s) 135 to compensate the effect of the disturbance transfer function D(s) 110 on the output controlled temperature 150. The actuator transfer function $G_2(s)$ 130 includes a function of an actuator controlling a heat transfer between the temperature controlled component and a heat sink; and may further include a function of an actuator controlling a heat transfer between the temperature controlled component and a heat source. As shown in FIG. 1, the actuator of the feedback control is also utilized for the feedforward control such that the addition of the feedforward transfer function F(s) 115 may be implemented with the same actuator as a conventional feedback control system which may already be fitted to a plasma processing chamber. The actuator may be implemented in any manner commonly employed in the art. For example, in one embodiment, the actuator includes one or more valves controlling a fluid coolant(s) flow rate coupled between the temperature controlled component and the heat sink/heat source. In a further embodiment, the actuator includes one or more resistive heating elements coupled to the temperature controlled component. The thermal mass transfer function H(s) 135 includes a function of the heat capacities of the heat sink/source and the temperature controlled component, etc.

Therefore, for the exemplary embodiment depicted in FIG. 1, the feedforward transfer function F(s) 115 takes the form:

$$F(s) = \frac{D(s)}{G_2(s)H(s)}, \text{ with}$$

$$D(s) = \frac{K_{disturbance}}{s + \frac{1}{\tau}}, \text{ and}$$

$$H(s) = \frac{K_H}{s + \frac{1}{\tau}}.$$

Figure 2:
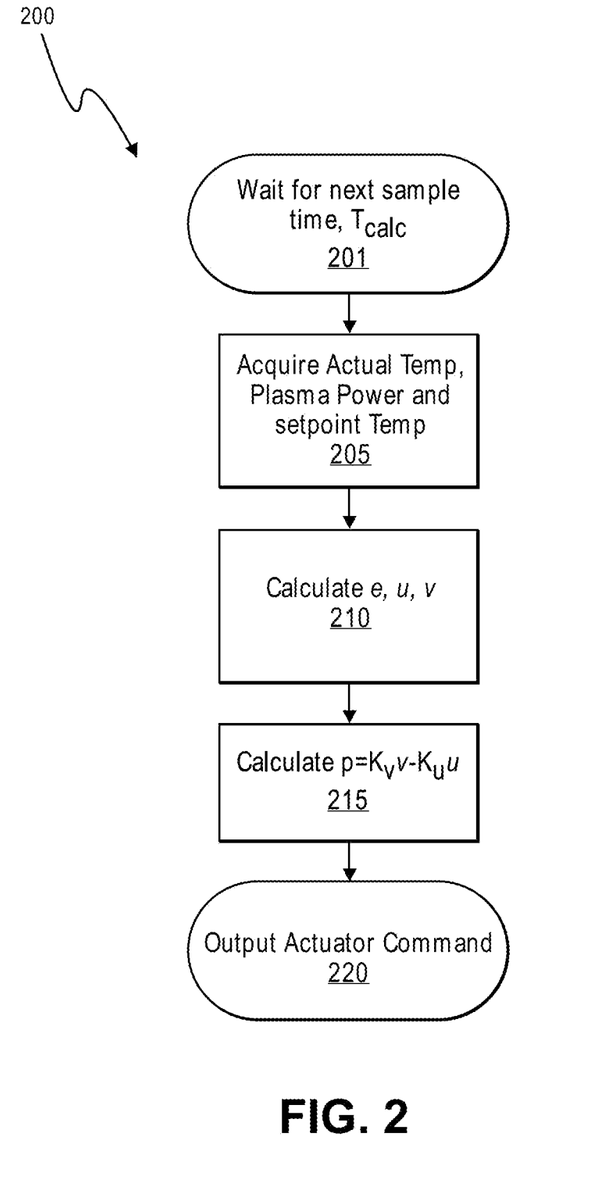
FIG. 2 illustrate a flow diagram illustrating particular operations in a method for controlling a plasma process chamber temperature with control system described in FIG. 1, in accordance with an embodiment of the present invention.
Figure 3A:
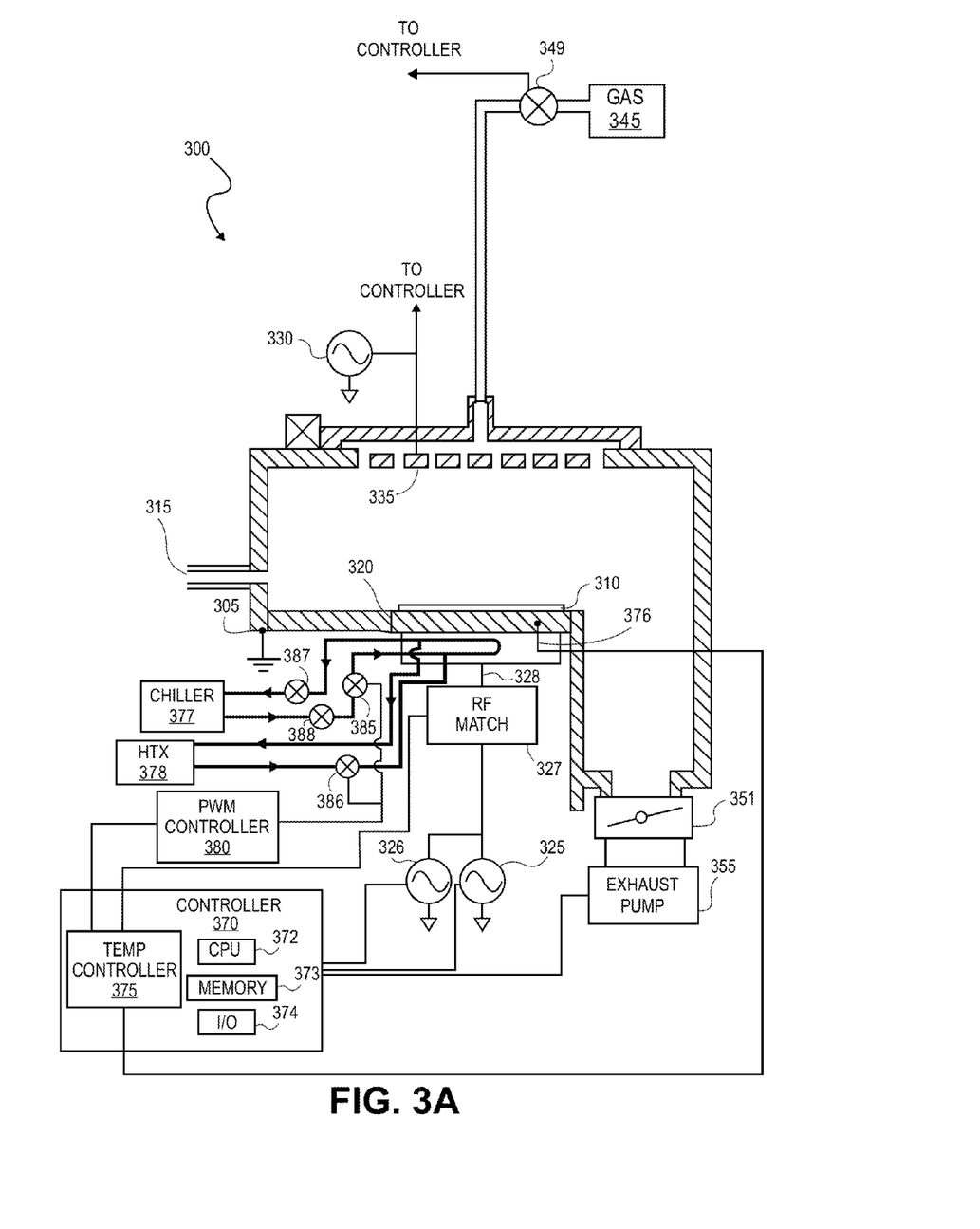
FIG. 3A illustrates a schematic of a plasma etch system including a temperature controller to execute the method illustrated in FIG. 2, in accordance with an embodiment of the present invention.

FIG. 2 illustrate a flow diagram illustrating particular operations in a method 200 for controlling a temperature with the control system 100 depicted in FIG. 1, in accordance with an embodiment of the present invention. FIG. 3A illustrates a cross-sectional schematic view of a plasma etch system 300 which includes a component for which temperature is controlled by the method 200 in a further embodiment of the invention. The plasma etch system 300 may be any type of high performance etch chamber known in the art, such as, but not limited to, Enabler™, MxP®, MxP+™, Super-E™, DPS II AdvantEdge™ G3, or E-MAX® chambers manufactured by Applied Materials of CA, USA. Other commercially available etch chambers may be similarly controlled. While the exemplary embodiments are described in the context of the plasma etch system 300, it should be further noted that the temperature control system architecture described herein is also adaptable to other plasma processing systems (e.g., plasma deposition systems, etc.) which present a heat load on a temperature controlled component.

The plasma etch system 300 includes a grounded chamber 305. A substrate 310 is loaded through an opening 315 and clamped to a temperature controlled electrostatic chuck 320. The substrate 310 may be any workpiece conventionally employed in the plasma processing art and the present invention is not limited in this respect. In particular embodiments, temperature controlled chuck 320 includes a plurality of zones, each zone independently controllable to the setpoint temperature 106 (FIG. 1). In the exemplary embodiment, a first thermal zone 322 is proximate a center of substrate 310 and a second thermal zone 321 is proximate to a periphery/edge of substrate 310. Process gases, are supplied from gas source 345 through a mass flow controller 349 to the interior of the chamber 305. Chamber 305 is evacuated via an exhaust valve 351 connected to a high capacity vacuum pump stack 355.

When plasma power is applied to the chamber 305, a plasma is formed in a processing region over substrate 310. A plasma bias power 325 is coupled to the chuck 320 (e.g., cathode) to energize the plasma. The plasma bias power 325 typically has a low frequency between about 2 MHz to 60 MHz, and in a particular embodiment, is in the 13.56 MHz band. In the exemplary embodiment, the plasma etch system 300 includes a second plasma bias power 326 operating at about the 2 MHz band which is connected to the same RF match 327 as plasma bias power 325. A plasma source power 330 is coupled through a match (not depicted) to a plasma generating element 335 to provide high frequency source power to inductively or capacitively energize the plasma. The plasma source power 330 typically, but not necessarily, has a higher frequency than the plasma bias power 325, such as between 100 and 180 MHz, and in a particular embodiment, is in the 162 MHz band. Bias power more directly affects the bias voltage on substrate 310, controlling ion bombardment of the substrate 310, while source power more directly affects the plasma density relatively independently of the bias on substrate 310. Notably, the system component to be temperature controlled by the control system 100 is neither limited to a chuck nor must the temperature controlled component directly couple a plasma power into the process chamber. In an alternative embodiment for example, a showerhead through which a process gas is input into the plasma process chamber is controlled with the temperature control system 100. For such showerhead embodiments, the showerhead may or may not function as an RF electrode.

The temperature controller 375, as the integrated temperature control software plane of the system controller 370, is to execute the temperature control method 200 and may be either software or hardware or a combination of both software and hardware configured. The temperature controller 375 is to output control signals affecting the rate of heat transfer between the chuck 320 and a heat source and/or heat sink external to the plasma chamber 305. Returning to FIG. 2, the method 200 begins at operation 201 in a wait state. With the passage of a sample time, $T_{calc}$, the current controlled temperature 150 (FIG. 1) is acquired, the setpoint temperature 106 is acquired, and the plasma power 105 is acquired at operation 205. A temperature setpoint for the heat sink may also be acquired. In the exemplary embodiment depicted in FIG. 3, the temperature controller 375 receives a controlled temperature input signal from a chuck temperate sensor 376. The temperature controller 375 acquires a chuck setpoint temperature from a process recipe file, for example stored in the memory 373, and the temperature controller 375 acquires a measured plasma power as described elsewhere herein.

In the exemplary embodiment, the temperature controller 375 is coupled, either directly, or indirectly (via the integrated control software plane 125) to a chiller 377 (heat sink) and/or a heat exchanger (HTX) 378 (heat source) such that the temperature controller 375 may acquire the temperature setpoint of the chiller 377 or the heat exchanger (HTX) 378. In such embodiments, a difference between the temperature of the chiller 377 and the setpoint temperature 106 (or the difference between the temperature of the heat exchanger 378 and the setpoint temperature 106, or both differences) is input into the feedfoward control line along with the plasma power. The chiller 377 is to provide a cooling power to the chuck 320 via a coolant loop thermally coupling the chuck 320 with the chiller 377. In the exemplary embodiment therefore, two coolant loops are employed. One coolant loop has a cold liquid (e.g., at a temperature setpoint of −15° C. while another loop contains liquid at high temperature (e.g., at a temperature setpoint of 60° C.). As such, when ρ is negative, cooling is required and a valve 385 is opened. Similarly when ρ is positive, then a valve 386 for the heating loop is opened. In an alternative embodiment however, an electrical resistive heater may be embedded into the chuck 320 in place of a heated coolant loop.

In the exemplary embodiment depicted in the FIG. 3A, the temperature controller 375 is further coupled to a pulse width modulation (PWM) controller 380. For embodiments where the valves 385 and 386 are digital and further operating such that only one is open at any given time, heating and cooling of the chuck 320 is referred to as "pulsed." A pulse of cooling power is provided when valve 385 is controlled to the open state for a period of time defined by a duty cycle, as further described elsewhere herein. Similarly, a pulse of heating power is provided to the chuck 320 when valve 386 is controlled to be in the open state for a period of time defined by the duty cycle. The PWM controller 380 may be of any type commonly available and configurable to operate the vales 385 and 386 for embodiments where those valves are digital (i.e., having binary states; either fully open or fully closed) at a duty cycle dependent on control signals sent by the temperature controller 375. Alternatively, a PID controller which supports PWM functionality and provides for external control of duty cycles, such as, but not limited to one of those commercially available from Azbil of Yamatake Corp., Japan, may be employed to implement feedforward control algorithms described herein. Alternatively, the PWM signal can be produced by a digital output port of a computer (e.g., controller 370) and that signal can be used to drive a relay that controls the valves to on/off positions. For embodiments where the temperature controller 375 implements the temperature control system 100 via the method 200, the PWM controller 380 is utilized exclusively as a driver of the digital valve 385.

It should also be noted that all of the control methods described herein can be applied to a proportional valve (infinitely variable between 0 and full flow) as an analog implementation of the exemplary digital valve implementations described herein. For analog valve embodiments, an analog voltages/current represent fractions of full flow (between 0 and 1, including 0 and 1) as the counterpart to a duty cycle for digital valve embodiments.

The temperature controller 375 need not be contained within, or provided by, the integrated control software plane 125 (see FIG. 1). Specifically, the functionality of temperature controller 375 may be instead provided as discrete system. For example, PID controllers, such as, but not limited to those commercially available from Azbil of Yamatake Corp., might in the future be designed to include additional feedforward inputs, such as the plasma power and chiller temperature. The discrete system may further be manufactured to include a processor having the ability to determine a feedforward control effort based on those feedforward inputs. As such, all the embodiments described herein for temperature control may be provided either by the temperature controller 375 as a facet of integrated control software plane 125 or as a facet of the PWM controller 380.

Figure 3B:
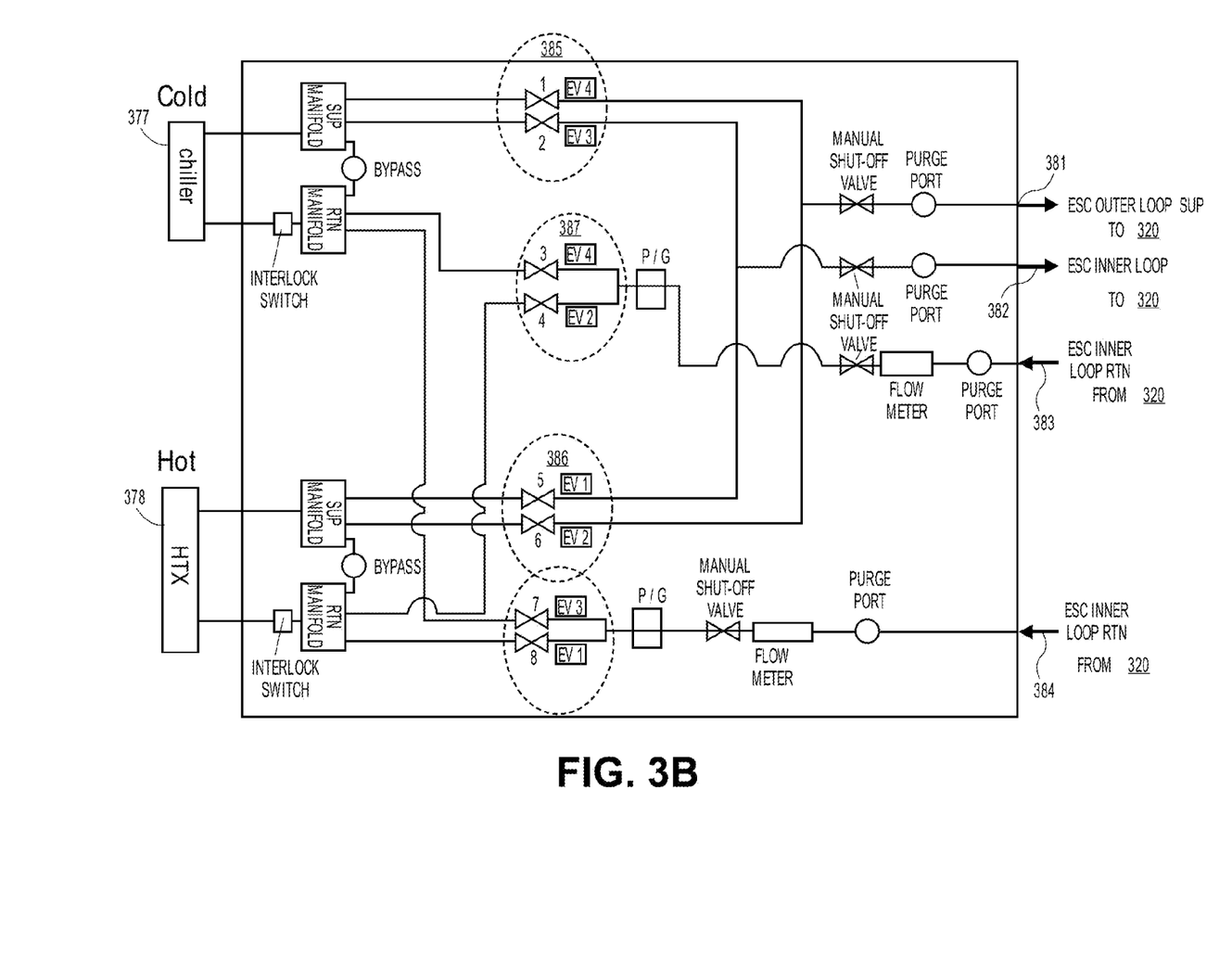
FIG. 3B illustrates a valve and plumbing schematic for a liquid heat source and heat sink employed in the plasma etch system of FIG. 3A, in accordance with an embodiment of the present invention.

FIG. 3B illustrates a valve and plumbing schematic for the heat transfer fluid-based heat source/sink employed in the plasma etch system of FIG. 3A, in accordance with an embodiment of the present invention. As further depicted, a pair of heat transfer fluid supply lines 381 and 382 are coupled to the chiller 377 and a heat transfer fluid channel embedded in the chuck 320 (subjacent to a working surface of the chuck upon which workpiece 310 is disposed during processing) via the valves 385 (EV 4 and EV 3, respectively). The line 381 is coupled to a heat transfer fluid channel embedded subjacent to a first, outer zone, of the chuck working surface while the line 382 is coupled to a heat transfer fluid channel embedded subjacent to a second, inner zone, of the chuck working surface to facilitate dual zone cooling. Similarly, the line 381 and 382 also couples the chuck 320 to the HTX 378 via the valves 386 (EV2 and EV 1, respectively) to facilitate dual zone heating. Return lines 383 and 384 complete the coupling of each of the outer and inner zone heat transfer fluid channels to the chiller/HTX, 377/378 via return valves 387 and 388. In a preferred embodiment, a measured forward RF bias power 328 energizing a plasma in the process chamber 305 at the current time (e.g., after passage of $T_{calc}$) is input into the feedforward control line as a plasma heat load (e.g., Watts). Plasma power setpoint values (e.g., from a process recipe file stored in a memory 373) may also be utilized as an input to the feedforward control line. Such power setpoint values, being predefined, may enable the feedforward transfer function F(s) 115 to be evaluated for the power setpoint prior to application of plasma power or prior to a change in the application of plasma power into the system and generate an anticipatory control effort. However, assuming the temperature control system 100 can react sufficiently quickly, the plasma power 105 is preferably coupled to a measured power output signal for greater accuracy of the plasma power applied at current time. Even for such embodiments, control effort determinations for future time would remain recipe-based.

In an embodiment, the plasma power 105 comprises a first bias power input to a chuck configured to support a workpiece during plasma processing. For example, the plasma power 105 may be set to the plasma bias power 325 (FIG. 3). For embodiments where the plasma processing system applies a plurality of bias power inputs to a chuck, the (weighted) sum of the plurality of bias powers is input to the temperature control system 100 as the plasma power 105. For example, in the exemplary embodiment depicted in FIG. 3, a sum of the plasma bias powers 325 and 326 are input as the plasma power 105. With the first and/or second plasma bias powers input as the plasma power 105, the feedforward transfer function F(s) 115 relates the bias power input (e.g., measured as forward bias power 328 output from RF match 327) to the feedforward control signal u defining a cooling effort to compensate the disturbance transfer function D(s) 110.

While in the exemplary embodiment the sum of the bias powers is input as the plasma power 105, it should be noted that one or more power input contributing to the total plasma power input into the process chamber may be excluded from the plasma power 105 as a function of weighting, or even negatively weighted. For example, referring to FIG. 3, the plasma source power 330 is excluded from the plasma power 105 where the control system 100 (FIG. 1) is to control the temperature of the electrostatic chuck 320. For such an embodiment, the plasma power 105 need not include the plasma source power 330, or include the plasma source power 330 with a relatively small weighting factor, because the heat load placed on the chuck 320 by the plasma source power 330 is relatively small. In alternative embodiments however, where the temperature to be controlled has an appreciable dependence on all plasma power input into a processing chamber, the feedforward control signal u output from the feedforward transfer function F(s) 115 may employ a larger weighting factor with the plasma source power 330.

Returning to FIG. 2, at operation 210 the temperature error signal e, the feedforward control signal u, and the feedback control signal v are computed at every $T_{calc}$ (e.g., by the CPU 372 executing the method 200 as an instance of temperature controller 375 (FIG. 3) stored in the memory 373). In the Laplace domain $$u(s)=F(s)p(s),$$

where u is the feedforward signal, F is the Feedforward transfer function and p is the plasma power. For the embodiment depicted in FIG. 3, the feedforward control signal u may be implemented in discrete time domain as:

$$u(t)=\beta_0 P(t)+\beta_1 P(t-T_{PWM})+\beta_2 P(t-T_{PWM})+\ldots \alpha_1 u(t-T_{PWM})+\alpha_2 u(t-2T_{PWM})+\alpha_3 u(t-3T_{PWM})+\ldots$$

where P(t) is the plasma power 105 input at the current $T_{calc}$, and where $T_{PWM}$ is a time increment of the pulse width modulation controller 380. In a particular embodiment, feedforward control signal u is computed as simply $\beta_0 P(t)$ to be based on the plasma power input at the current time (e.g., $T_{calc}$).

In a further embodiment, because the plasma power to be requested in future time periods is determinable (e.g., from the process recipe file), the feedforward expression further includes the terms $\theta_1 P(t+T_{PWM})+\theta_2 P(t+2T_{PWM})$ to compensate for lag in the effect of the coolant flow on the controlled temperature. In another embodiment, the heat transfer required to achieve the controlled temperature 150 is dependent on the heat sink (e.g., chiller 377) setpoint temperature and/or heat source (e.g., heat exchanger 378) setpoint temperature such that the additional coolant temperature dependent term $\delta_c(T_{SP}-T_{heat\,sink})+\delta_h(T_{SP}-T_{heat\,source})$ added to the feedforward control signal u, where $T_{SP}$ is the controlled temperature 150. Each of $\delta_c$ and $\delta_h$ may be defined as a polynomial function of the temperature difference between the setpoint and the heat sink/heat source. For example, in one embodiment $\delta_c=\alpha_0+\alpha_1(T_{SP}-T_{heat\,sink})+\alpha_2(T_{SP}-T_{heat\,sink})^2+\alpha_3(T_{SP}-T_{heat\,sink})^3$ With $\delta_h$ taking a similar form. The entire feedforward equation can also have factors for temperature dependence, $\Omega_{hot}$ and $\Omega_{cold}$, such that the net feedfoward control signal u becomes:

$$u(t) = \Omega_{hot}(T_{SP} - T_{heat\,source})\Omega_{cold}(T_{SP} - T_{heat\,sink})$$
$$\{\beta_o P(t) + \beta_1 P(t-T_{PWM}) + \beta_2 P(t-2T_{PWM}) + \ldots \alpha_1 u(t-T_{PWM}) +$$
$$\alpha_2 u(t-2T_{PWM}) + \alpha_3 u(t-3T_{PWM}) + \ldots \theta_1 P(t+T_{PWM}) +$$
$$\theta_2 P(t+2T_{PWM}) + \delta_c(T_{SP} - T_{heat\,sink}) + \delta_h(T_{SP} - T_{heat\,source})\}.$$

Similarly, the feedback control signal v is v(t)=G(s)ϵ(s) in the Laplace domain and may be implemented in discrete time domain as:

$$v(t)=\lambda_0 e(t)+\lambda_1 e(t-T_{PWM})+\lambda_2 P(t-T_{PWM})+\ldots \eta_1 v(t-T_{PWM})+\eta_2 v(t-2T_{PWM})+\eta_3 v(t-3T_{PWM})+\ldots$$

Where e(t) is the temperature error signal (difference between controlled temperature 150 and setpoint temperature 106) at $T_{calc}$. In a particular embodiment, feedback control signal v is computed as simply $\lambda_0 e(t)$. While the operation 210 is performed every $T_{calc}$, the control computations are to use input temperatures and plasma power values input at some lower frequency corresponding to times t, $t-T_{PWM}$, etc. Values for the parameters of u, v, plasma power 105 (P), controlled temperature 150, and setpoint temperature 106 may be stored in a data array and those stored values corresponding to the discrete times of t, $t-T_{PWM}$ may then be utilized in subsequent control calculations.

Figure 3C:
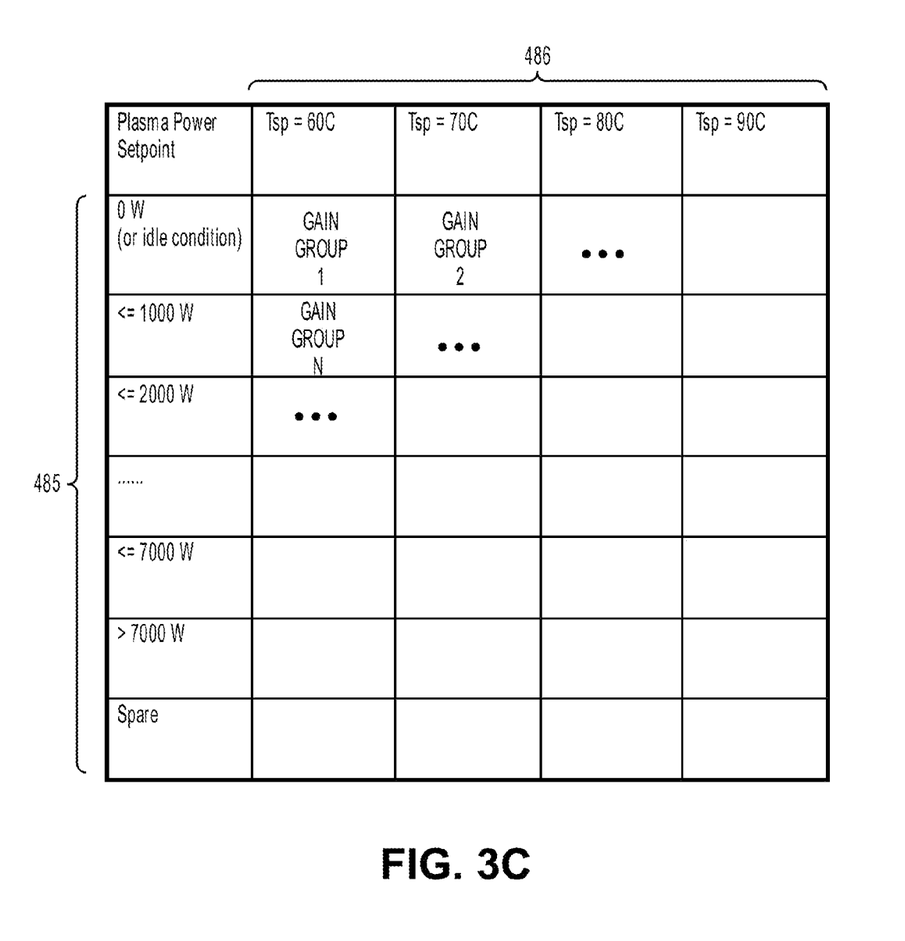
FIG. 3C illustrates a gain group lookup table, in accordance with an embodiment of the present invention.

At operation 215, a control actuator output signal ρ is determined from the combination of the feedforward signal u and feedback signal v and then output to the actuator at operation 220. In one embodiment, a constant gain $K_v$ is applied to the feedfoward control signal u and a constant gain $K_u$ is applied to the feedforward control signal v such that the control actuator output signal ρ is calculated as $\rho(t) = K_v v - K_u u$. The gains $K_v$, $K_u$ provide a system operator a simple interface to access the combined feedforward and feedback control line in two simple factors and may be provided as part of a group of gain values determined by the temperature controller 375 on the basis of one or more variables (keys). In one such embodiment, a gain group is accessed from a database or lookup table based at least on the plasma power input into the chamber 305 for a current recipe step. In another embodiment, illustrated in FIG. 3C, a first group of gain values associated with a key value pairing of the plasma input power and the setpoint temperature is determined for the first executing recipe step. As shown in FIG. 3C, the setpoint temperature 486 is a first key value and plasma power input 485 is a second key value. Gain groups 1, 2, 3, etc. containing gain values for the various control signals in system 100 (e.g., $K_v$, $K_u$) may be determined from the temperatures 486, plasma power inputs 485 or a pairing of the two corresponding to the conditions of the executing recipe step. Gains defined in a particular gain group may then be applied as further described elsewhere herein with reference to FIG. 2.

Figure 3D:
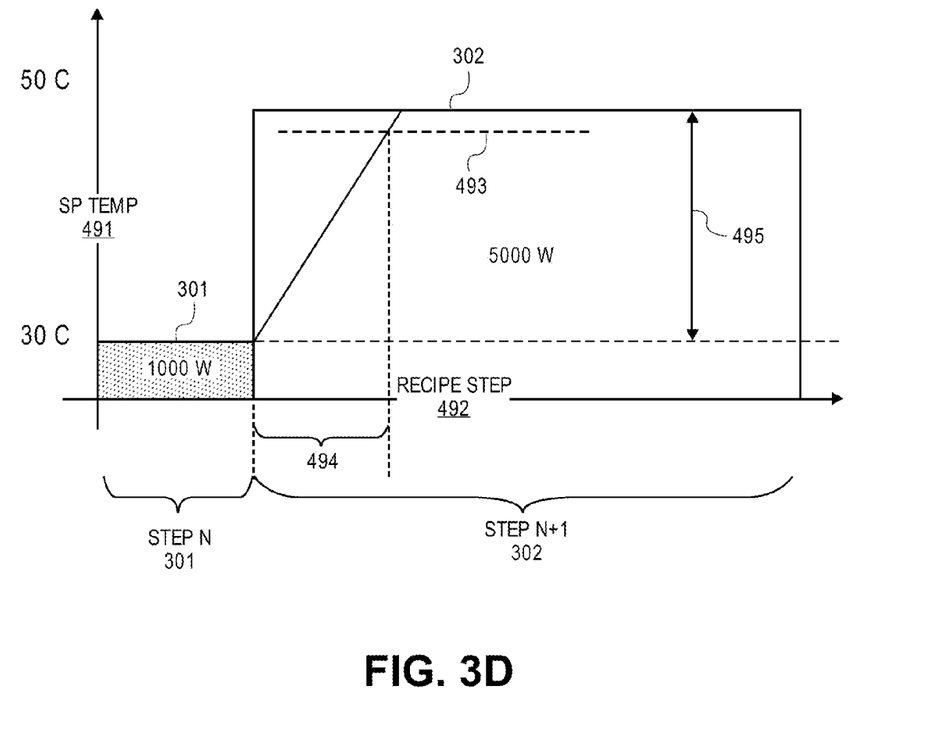
FIG. 3D illustrates a control algorithm for addressing changes in setpoint temperatures between two steps in a plasma process recipe, in accordance with an embodiment of the present invention.

In an embodiment where a controlled temperature is changed between steps of an executing recipe (e.g., to help control polymer deposition, etc.), transient specific control parameters may be determined and communicated by the temperature controller 375. FIG. 3D illustrates a transient control period 494 for addressing changes in setpoint temperatures between two consecutive steps executed in a plasma process recipe, in accordance with an embodiment of the present invention. The recipe step N (301) and recipe step N+1 (302) are illustrated with the recipe step 492 along the x-axis and setpoint temperature 491 along the y-axis. In the depicted example, a plasma input power of 1000 W is applied during the recipe step N (301) while the setpoint temperature is 30° C. For the recipe step N+1 (302), 5000 W of plasma power is applied with a setpoint temperature of 50° C. In one embodiment where the duration of the transient control period 494 is dependent on a change in the setpoint temperature and/or change in plasma power, a transient response gain group (e.g., defining high gain values) is applied for an amount of time required to achieve a percentage of the change in setpoint temperature. For the example, in FIG. 3D, the transient control period 494 occurs for 90% of the 20° C. rise in temperature between step N (301) and step N+1 (302), or until the temperature reaches the threshold 493 (48° C.). As such, this transient group of gain values is applied for a duration which is longer when there is a greater change in setpoint temperature. A similar algorithm may be applied based on the magnitude of change in plasma power, for example increasing the duration of the transient control period 494 with greater changes in plasma power between steps. Alternatively, the transient control parameters may simply be applied for fixed time.

Figure 3E:
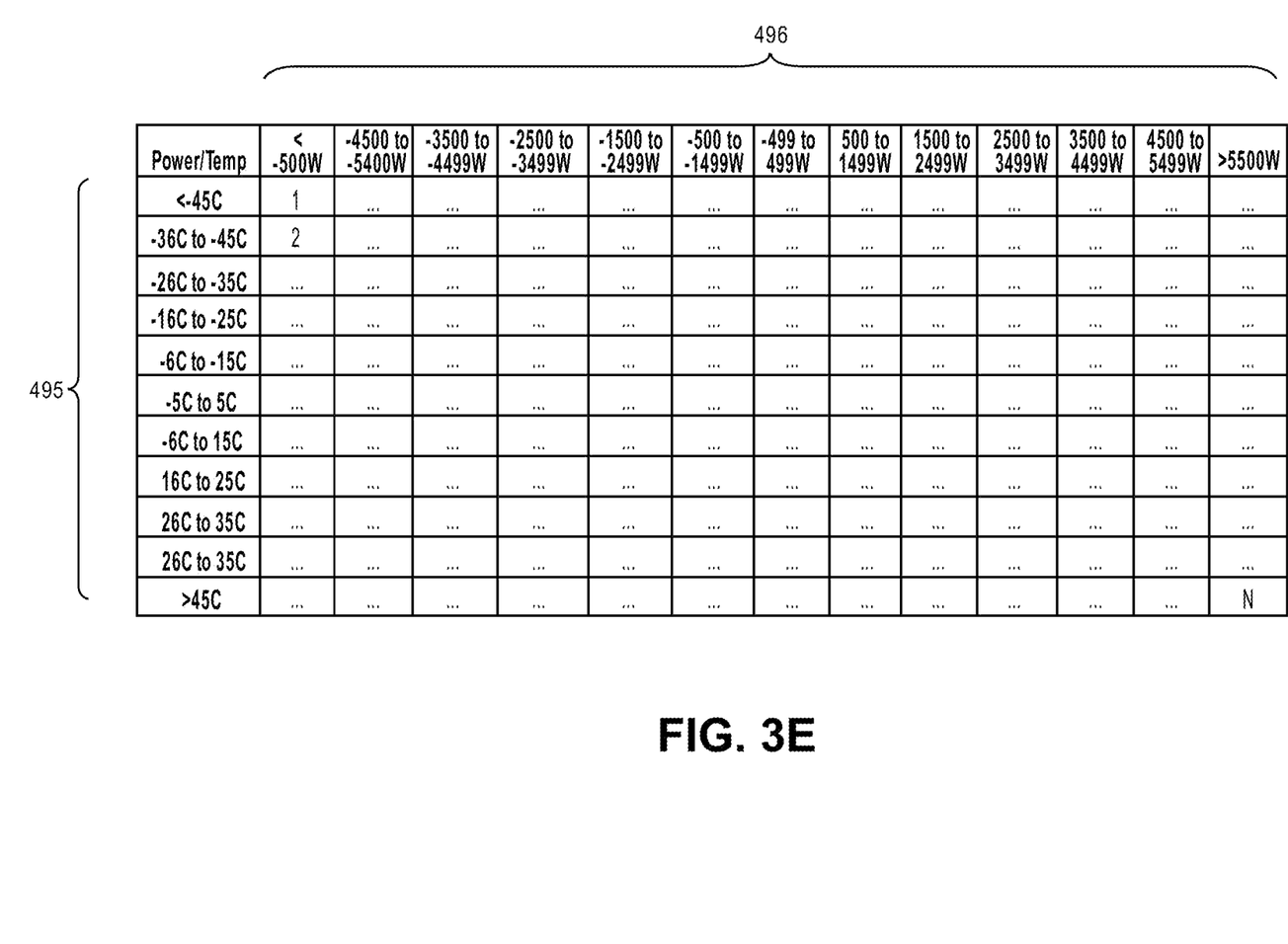
FIG. 3E illustrates a lookup table for a gain group employed by the control algorithm of FIG. 3D, in accordance with an embodiment of the present invention.

In an embodiment, transient response gain groups (e.g., $K_v$, $K_u$) are associated with at least one of a change in plasma input power or a change in the setpoint temperature and may further be associated with a key value pairing a change in the plasma input power with a change in the setpoint temperature. FIG. 3E, for example, illustrates a lookup table for a transient gain group employed by the control transient control period 494 in FIG. 3D. As shown in FIG. 3E, a transient gain group is associated with changes of plasma input power 496 and changes of setpoint temperature 495. Thus, in particular embodiments, gain groups and transient gain groups may be determined based on settings in a recipe file executed by the processing system for enhanced component temperature control.

Depending on the value of the control actuator output signal ρ, heat transfer between one or more of a heat sink and heat source is modulated. In FIG. 3A therefore, where the control actuator output signal ρ is of a first sign (e.g., ρ<0), a command may then be provided in a form executable by the PWM controller 380 to drive the valves 385 at a duty cycle which increases the heat transfer between the chiller 377 and the chuck 320 and thereby reduce the controlled temperature 150. Where the control actuator output signal ρ is of a second sign (e.g., ρ>0), a command may then be provided in a by the PWM controller 380 to drive the valves 386 at a second duty cycle to induce heat transfer between the heat exchanger 378 and the chuck 320 and thereby increase the controlled temperature 150. For example, in a situation where for a recipe step in which plasma power is reduced from a previous level (e.g., turned off) then ρ changes from a more negative number to a less negative number, the coolant flow from chiller 377 is reduced due to a decrease in the duty cycle of valves 385. In a situation where setpoint temperature is increased while the total plasma power is constant, ρ again changes from a more negative number to a less negative number and the coolant flow from chiller 377 is reduced in response to a decrease in the duty cycle of valves 385. If ρ changes to a positive number, then the duty cycle of valves 386 change from 0 to a positive number which in turn causes the flow of hot coolant from heat exchanger 378 to the chuck 320.

Figure 4:
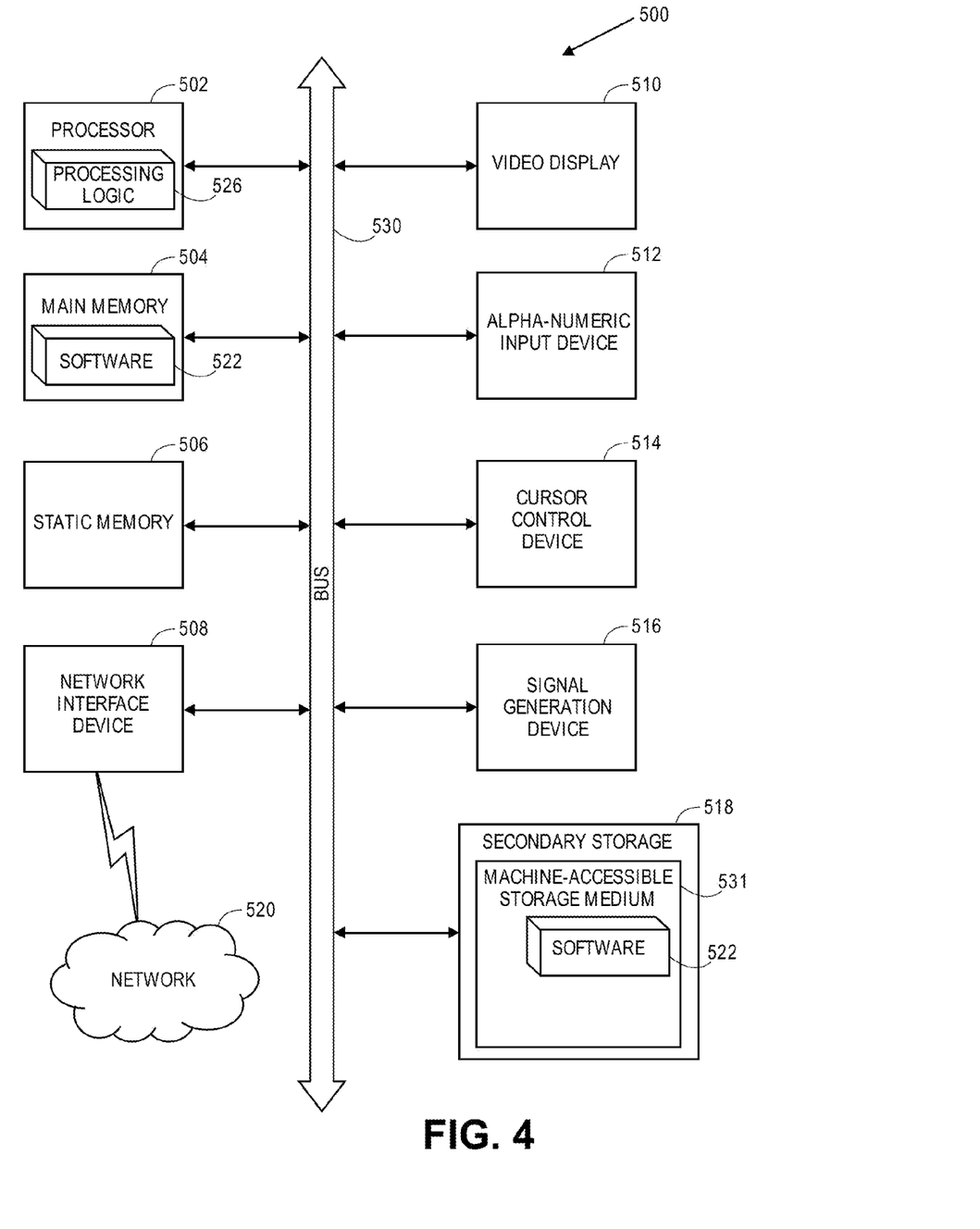
FIG. 4 illustrates a block diagram of an exemplary computer system incorporated into the plasma etch system depicted in FIG. 3A, in accordance with one embodiment of the present invention.

FIG. 4 illustrates a diagrammatic representation of a machine in the exemplary form of a computer system 500 which may be utilized to perform the temperature control operations described herein. In one embodiment, the computer system 500 may be provisioned as the controller 370 in the plasma etch system 300. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

The processor 502 represents one or more general-purpose processing devices such as a microprocessor, central processing unit, or the like. The processor 502 may be one or more general-purpose or special-purpose processing devices such as an application specific integrated circuit (ASIC), a field programmable gate array (FPGA), a digital signal processor (DSP), network processor, or the like. The processor 502 is configured to execute the processing logic 526 for performing the temperature control operations discussed elsewhere herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the temperature control algorithms described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

The machine-accessible storage medium 531 may further be used to store a set of instructions for execution by a processing system and that cause the system to perform any one or more of the temperature control algorithms described herein. Embodiments of the present invention may further be provided as a computer program product, or software, that may include a machine-readable medium having stored thereon instructions, which may be used to program a computer system (or other electronic devices) to control a plasma processing chamber temperature according to the present invention as described elsewhere herein. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, and flash memory devices, etc.

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A method for controlling a process temperature during a plasma processing of a workpiece, comprising:
   determining a plasma power input to a process chamber performing the plasma processing on the workpiece;
   determining a feedback gain value and a feedforward gain value from a lookup table, wherein the lookup table includes a plurality of feedforward gain values and feedback gain values that are each associated with at least one of the plasma power input, a setpoint process temperature, a change in the plasma power input, or a change in the setpoint process temperature;
   combining a feedback control signal with a feedforward control signal based on the plasma power to create a temperature control signal, wherein the feedback control signal is multiplied by the feedback gain value and the feedforward control signal is multiplied by the feedforward gain value; and
   controlling a temperature in the process chamber with said temperature control signal.

2. The method of claim 1, wherein the feedforward control signal is further based on a difference between the temperature of an external heat sink and a setpoint of the temperature being controlled, and wherein the temperature controlling further comprises compensating an error between the temperature, as measured, and the temperature setpoint.

3. The method of claim 1, wherein the plasma power comprises a first bias power input to a chuck configured to support the workpiece and wherein the feedforward control signal comprises a transfer function between the bias power input and the chuck temperature.

4. The method of claim 3, wherein the plasma power comprises a second bias power input to the chuck and wherein the feedforward control signal comprises a transfer function between a total of the first and second bias power and the chuck temperature.

5. The method of claim 1, wherein controlling the temperature further comprises: controlling a coolant fluid flow between the process chamber and a heat sink external to the process chamber based at least in part on the feedforward control signal.

6. The method of claim 5, wherein controlling the temperature further comprises: controlling the coolant flow and controlling a heat source coupled to the chuck based on a feedback control signal added to the feedforward control signal.

7. The method of claim 5, wherein controlling the coolant fluid flow further comprises modulating a pulse width modulation duty cycle to fully open and fully close a valve through which the coolant fluid flows.

8. The method of claim 1, wherein the plasma power heat load comprises a source power input to the process chamber and wherein the feedforward control signal comprises a transfer function between the source power input and a process chamber temperature.

9. A method for controlling a process temperature during a plasma processing of a workpiece, comprising:
   determining a plasma power input to a process chamber performing the plasma processing on the workpiece;
   combining a feedback control signal with a feedforward control signal based on the plasma power to create a temperature control signal; and
   controlling a temperature in the process chamber with said temperature control signal, wherein controlling the temperature in the process chamber further comprises:
     controlling a first coolant fluid flow between the process chamber and a heat sink external to the process chamber and a second coolant fluid flow between the process chamber and a heat exchanger external to the process chamber based at least in part on the feedforward control signal; and
     modulating a pulse width modulation duty cycle to fully open and fully close a first valve through which the first coolant fluid flows and a second valve through which the second coolant fluid flows, and wherein one of the first and second valves is to be in a fully open position when the other of the first and second valves is to be in a fully closed position.

10. The method of claim 9, wherein the feedforward control signal is further based on a difference between the temperature of an external heat sink and a setpoint of the temperature being controlled, and wherein the temperature controlling further comprises compensating an error between the temperature, as measured, and the temperature setpoint.

11. The method of claim 9, wherein the plasma power comprises a first bias power input to a chuck configured to support the workpiece and wherein the feedforward control signal comprises a transfer function between the bias power input and the chuck temperature.

12. The method of claim 11, wherein the plasma power comprises a second bias power input to the chuck and wherein the feedforward control signal comprises a transfer function between a total of the first and second bias power and the chuck temperature.

13. The method of claim 9, wherein controlling the temperature further comprises: controlling the coolant flow and controlling a heat source coupled to the chuck based on a feedback control signal added to the feedforward control signal.

14. The method of claim 9, wherein the plasma power heat load comprises a source power input to the process chamber and wherein the feedforward control signal comprises a transfer function between the source power input and a process chamber temperature.

* * * * *